United States Patent
Jobert et al.

(10) Patent No.: US 9,263,395 B2
(45) Date of Patent: Feb. 16, 2016

(54) SENSOR HAVING DAMPING

(75) Inventors: Tristan Jobert, Lyons (FR); Uwe Hansen, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 328 days.

(21) Appl. No.: 13/521,573

(22) PCT Filed: Jan. 14, 2011

(86) PCT No.: PCT/EP2011/050437
§ 371 (c)(1),
(2), (4) Date: Nov. 7, 2012

(87) PCT Pub. No.: WO2011/089066
PCT Pub. Date: Jul. 28, 2011

(65) Prior Publication Data
US 2013/0044442 A1    Feb. 21, 2013

(30) Foreign Application Priority Data

Jan. 19, 2010   (DE) .......................... 10 2010 001 023

(51) Int. Cl.
*H05K 1/18*       (2006.01)
*H01L 23/538*    (2006.01)
*H01L 23/31*      (2006.01)

(52) U.S. Cl.
CPC ......... *H01L 23/5387* (2013.01); *H01L 23/3121* (2013.01); *H01L 2224/48091* (2013.01); *H01L 2224/48137* (2013.01); *H01L 2924/1461* (2013.01); *H05K 1/18* (2013.01); *Y10T 29/4913* (2015.01)

(58) Field of Classification Search
CPC .............................. H01L 23/5387; H05K 1/18
USPC ............................... 361/749; 174/254; 29/832
See application file for complete search history.

(56) References Cited

U.S. PATENT DOCUMENTS

| | | | |
|---|---|---|---|
| 5,025,666 A | 6/1991 | Kobayashi et al. | |
| 5,776,797 A * | 7/1998 | Nicewarner et al. | 438/107 |
| 6,102,710 A * | 8/2000 | Beilin et al. | 439/67 |
| 6,121,676 A * | 9/2000 | Solberg | 257/686 |
| 6,208,521 B1 * | 3/2001 | Nakatsuka | 361/749 |
| 6,225,688 B1 * | 5/2001 | Kim et al. | 257/686 |
| 6,396,709 B1 * | 5/2002 | Schmich | 361/760 |
| 6,462,412 B2 * | 10/2002 | Kamei et al. | 257/723 |

(Continued)

FOREIGN PATENT DOCUMENTS

| | | |
|---|---|---|
| CN | 101042433 | 9/2007 |
| DE | 102007011170 | 9/2007 |

(Continued)

OTHER PUBLICATIONS

International Search Report, PCT International Application No. PCT/EP2011/050437, dated May 20, 2011.

*Primary Examiner* — Jeremy C Norris
*Assistant Examiner* — Nathan Milakovich
(74) *Attorney, Agent, or Firm* — Kenyon & Kenyon LLP

(57) ABSTRACT

A sensor device, having a flexible printed circuit board that has a fastening section for a chip structure, a chip structure situated on the fastening section of the flexible printed-circuit board, and a damper element for damping the chip structure from mechanical influences. The fastening section of the flexible printed circuit board, the chip structure and the damper element are situated one on top of the other.

15 Claims, 6 Drawing Sheets

(56) References Cited

U.S. PATENT DOCUMENTS

| | | | | |
|---|---|---|---|---|
| 6,469,377 | B1* | 10/2002 | Kondo | 257/686 |
| 7,071,547 | B2* | 7/2006 | Kang et al. | 257/686 |
| 7,116,557 | B1* | 10/2006 | Raby et al. | 361/720 |
| 7,368,695 | B2* | 5/2008 | Kang et al. | 250/208.1 |
| 7,398,687 | B2 | 7/2008 | Nakajima et al. | |
| 7,524,703 | B2* | 4/2009 | Cady et al. | 438/125 |
| 7,656,678 | B2* | 2/2010 | Partridge et al. | 361/767 |
| 8,058,145 | B2* | 11/2011 | Tateishi et al. | 438/456 |
| 8,552,473 | B2* | 10/2013 | Tateishi et al. | 257/254 |
| 8,556,611 | B2* | 10/2013 | Dolan et al. | 425/89 |
| 2001/0006252 | A1* | 7/2001 | Kim et al. | 257/688 |
| 2005/0279916 | A1 | 12/2005 | Kang et al. | |
| 2013/0199295 | A1* | 8/2013 | Hoefer et al. | 73/526 |
| 2013/0270419 | A1* | 10/2013 | Singh et al. | 250/208.1 |
| 2014/0268594 | A1* | 9/2014 | Wang | H05K 1/183 361/749 |

FOREIGN PATENT DOCUMENTS

| | | |
|---|---|---|
| DE | 102009000571 | 8/2010 |
| EP | 0660081 | 6/1995 |
| EP | 0806589 | 11/1997 |
| JP | 63-250541 | 10/1988 |
| JP | 7-260822 | 10/1995 |
| JP | 8-213774 | 8/1996 |
| JP | 11-211749 | 8/1999 |
| JP | 2001-324333 | 11/2001 |
| JP | 2004-200596 | 7/2004 |
| JP | 2005-202175 | 7/2005 |
| JP | 2005-257637 | 9/2005 |
| JP | 2007-47023 | 2/2007 |
| JP | 2009-2964 | 1/2009 |

* cited by examiner

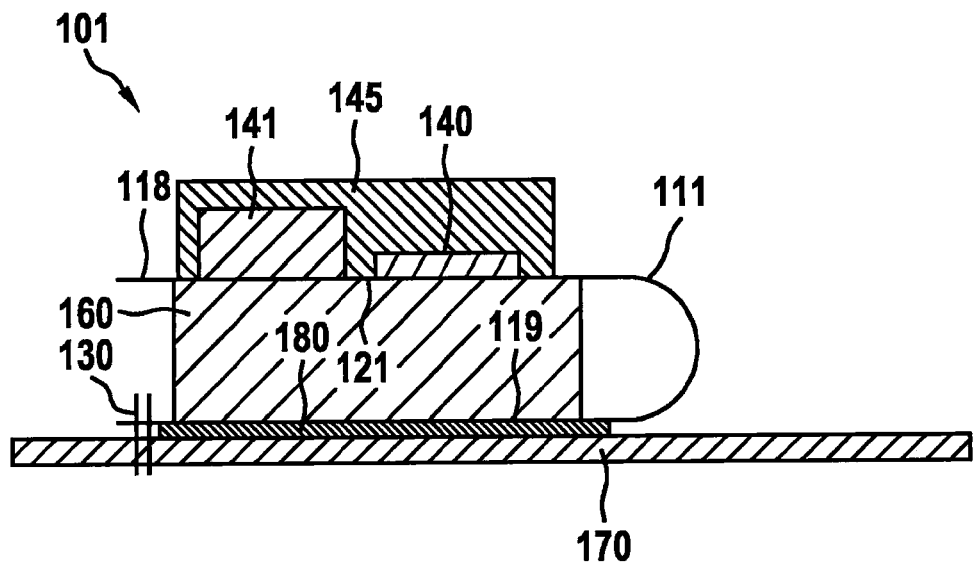
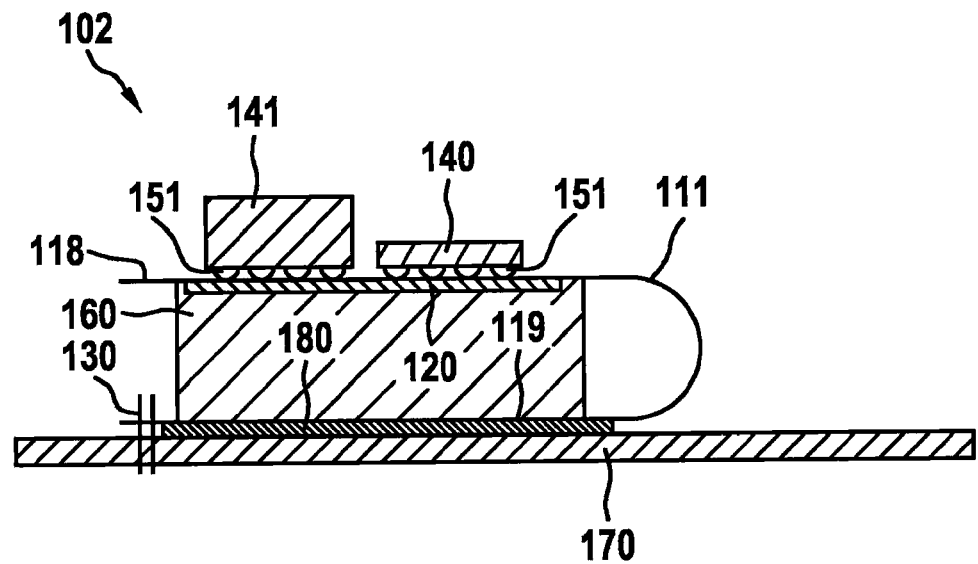

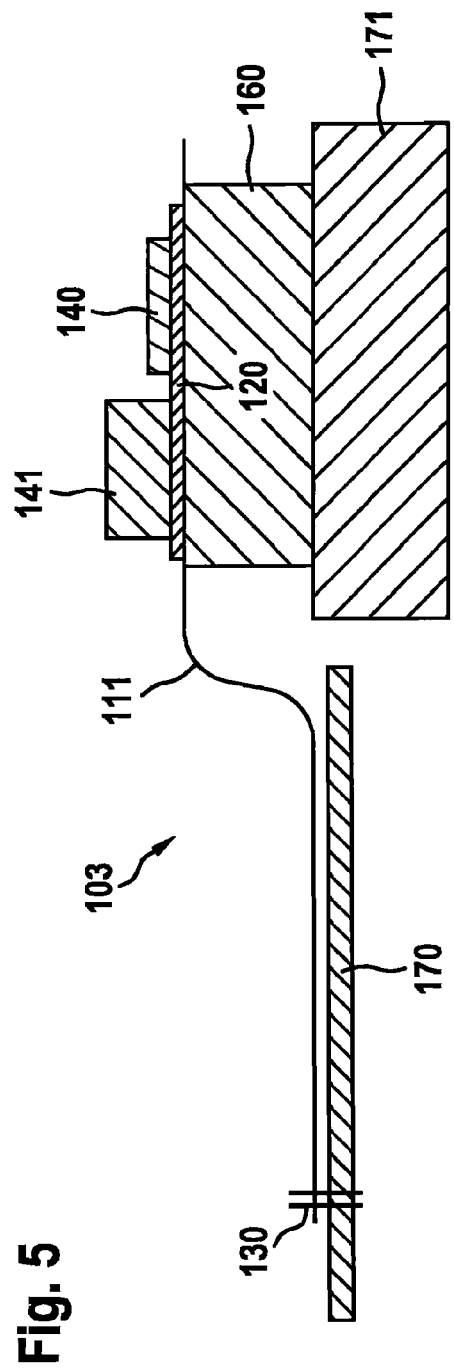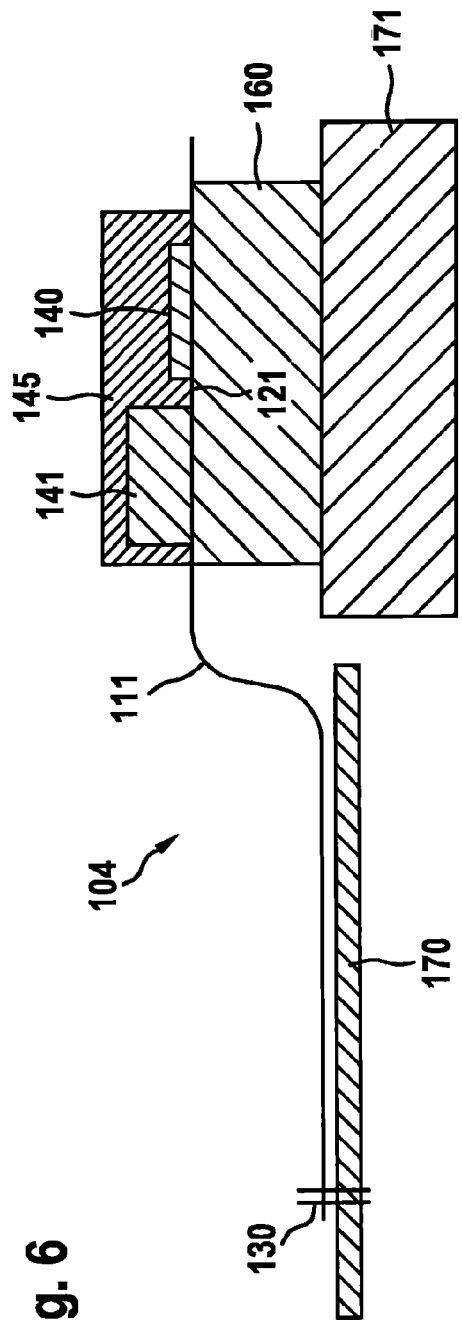

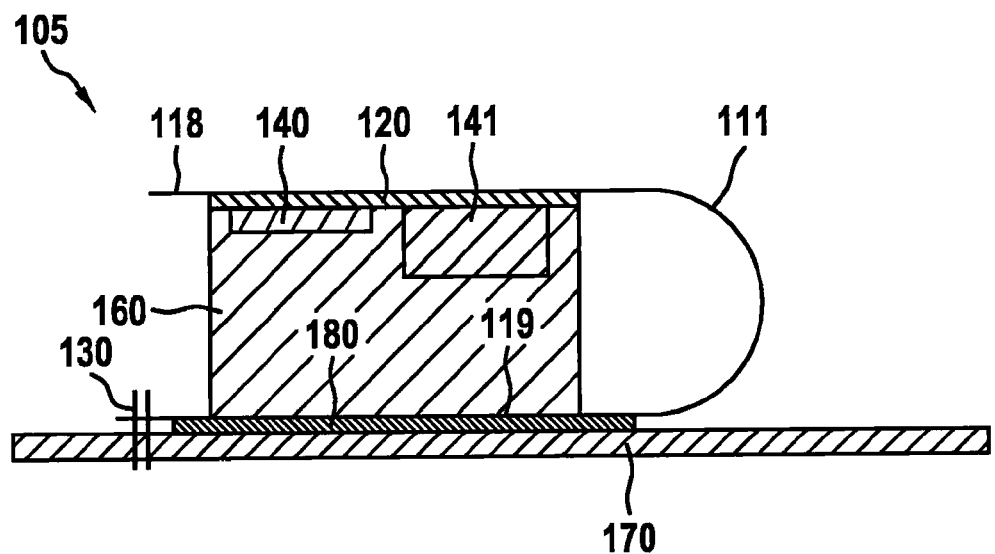
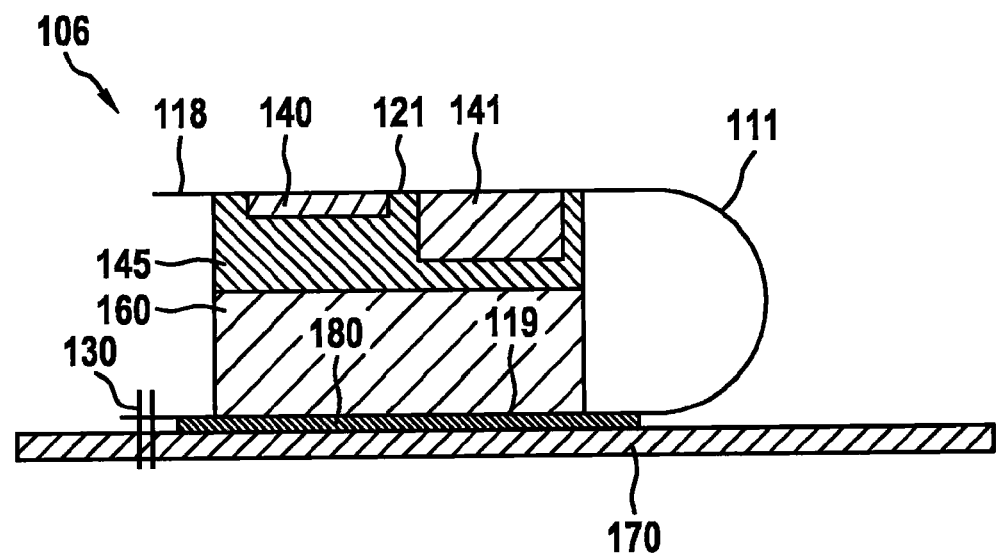

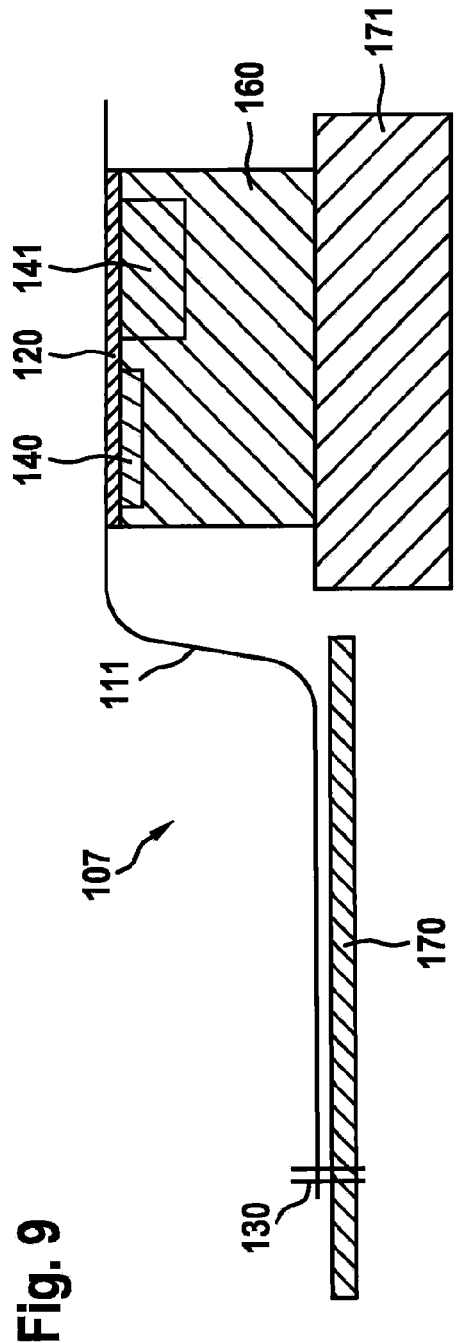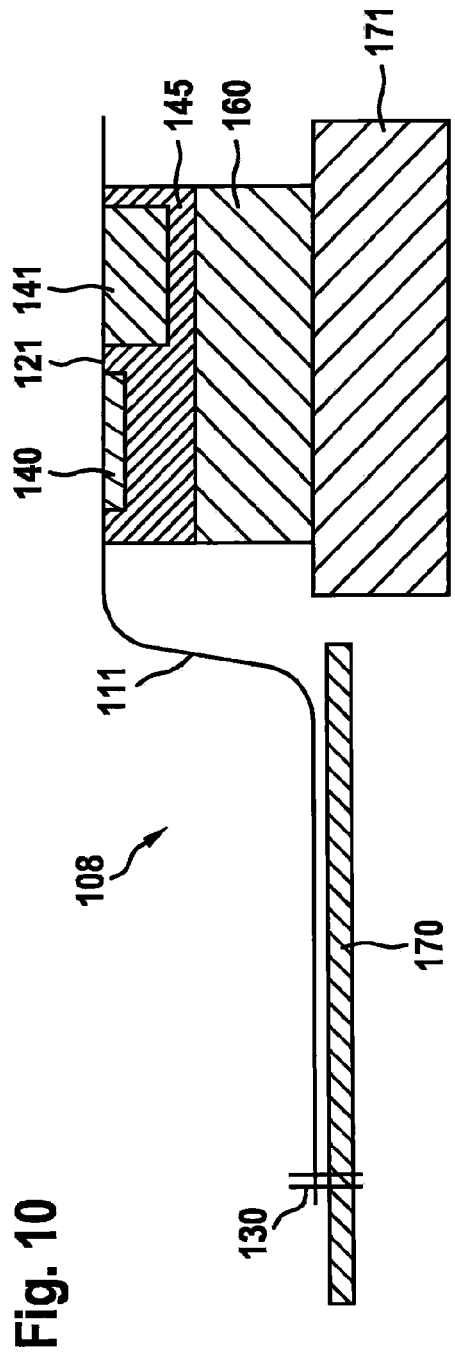

SENSOR HAVING DAMPING

FIELD OF THE INVENTION

The present invention relates a sensor device having a flexible printed circuit board, a chip structure situated on a fastening section of the flexible printed circuit board and a damping element for damping the chip structure from mechanical influences. The present invention also relates to a method for producing a sensor device.

BACKGROUND INFORMATION

Sensor devices which are used, for example, in security systems of motor vehicles, usually have a chip structure having a sensor chip and an evaluation chip that is electrically connected to the sensor chip. The sensor chip is developed in the form of a micromechanical component (MEMS, microelectromechanical system), in order to record a physical measured quantity, such as an acceleration or a rotational rate. The evaluation chip is used for controlling the sensor chip and for the evaluation or further processing of measuring signals of the sensor chip.

Depending on their applications, the sensor devices may be developed undamped or damped. In one conventional specific embodiment, the chips are provided on a floor plate, which is situated within a frame-shaped housing base body (premold frame). The base plate is surrounded at its edge by an electric damper element, and connected on the inside to the housing frame by the damper element. In this way, the floor plate is deflectable with respect to the housing frame, whereby damping of the chip from outer mechanical influences, such as jolts or vibrations is made possible. The housing frame has contact elements, via which the sensor device is able to be contacted from the outside. Within the housing frame, the contact elements are electrically connected via bonding wires to the evaluation chip.

In the conventional sensor device, there may be the problem that the damping is effective only at certain frequencies, whereby vibrations are able to lead to interferences of the sensor chip and with that, of the measuring signals. The damping properties are a function of the geometry of the damper element and the material properties of the damper material (usually a silicone). Besides the required elasticity, however, the damper element is subject to further requirements, so that selection of the material is greatly restricted. It is required, for example, that the damper material be sprayable, in order to make simple processing possible, as well as good adhesion with regard to the floor plate (e.g., steel) and the housing frame (e.g., plastic). For the decoupling of various interference frequencies, it may be required for each case to have its own housing, which is connected with high expenditure.

Furthermore, the construction of the sensor device may lead to the impairment or interruption of the electrical connection. Jolts or accelerations, which may occur, for instance, during a drop test or improper handling of the sensor device, result in a relatively great deflection of the base plate with respect to the housing frame. This creates a corresponding relative motion in the bonding wires, which are fastened to the evaluation chip and at the housing frame. Connected with this is a drifting away of the bonding wires or tearing or loosening of the bonding wires from their contact locations. The essentially horizontal construction of the sensor device also has a relatively great lateral requirement for space. Also provided are dead areas in the form of sealing areas within the housing frame and around the base plate, by which the base area of the sensor (footprint) is clearly greater than that of the chip.

German Patent Application No. DE 10 2009 000 571.4 describes a further damped sensor device in which an electrical connection between contact elements of a housing frame and an evaluation chip is produced with the aid of a flexible printed-circuit board, in order to achieve a construction that is insensitive to jolts. In one specific embodiment, the flexible printed circuit board has a section used as the base part, on which the chip is situated. The base plate is surrounded at its edge by an electric damper element, and connected on the inside to the housing frame by the damper element.

SUMMARY

It is an object of the present invention to provide an improved sensor device which has a construction that is not sensitive to jolts and has small lateral space requirements. Furthermore, it is an object of the present invention to specify a method for producing such a sensor device.

An example sensor device is provided in accordance with the present invention, which has a flexible printed circuit board having a fastening section for a chip structure, a chip structure situated on the fastening section of the flexible printed circuit board and a damper element for damping the chip structure with respect to mechanical influences. The fastening section of the flexible printed-circuit board, the chip structure and the damper element are situated one on top of the other.

Based on the arrangement one on top of the other, of the fastening section of the flexible printed-circuit board, the chip structure and the damper element, the sensor device has a relatively small lateral space requirement. The use of the flexible printed circuit board, via which an electrical connection is able to be produced between the chip structure and other components, also makes possible an improved resistance to falls and an insensitivity to jolts. Also, if required, a greater selection of possible materials may be available for the damping material.

In one preferred specific embodiment, the flexible printed circuit board has a first side and a second side opposite the first side. The chip structure is situated on the first side and the damper element is situated on the second side of the flexible printed circuit board.

In a further preferred specific embodiment, the damper element borders on the chip structure. In this instance, it may further be provided that the damper element additionally encloses the chip structure. In this embodiment, besides the damping function, the damper element may also enable a protection or a passivation of the chip structure.

In one additional preferred specific embodiment, the flexible printed circuit board has a U-shaped form, having a first and a second leg, which enclose an intermediate area. This additionally favors a space-saving design of the sensor device.

In this connection, it may be provided that the damper element is situated in the intermediate area. It is also possible for the damper element and the chip structure to be situated in the intermediate area.

In another preferred specific embodiment, the fastening section of the flexible printed circuit board is a rigid section. In this way, chips that are not in a housing are able to be reliably situated or carried on the fastening section of the printed circuit board.

Different specific embodiments come into consideration with regard to the chip structure. The chip structure may include, for example, a sensor chip and an evaluation chip.

It is also possible to have a chip module in which chips are situated in a housing. In this case, (additional) damping of the chip module is able to be provided with the aid of the sensor device.

The present invention also provides an example method for producing a sensor device. The example method includes providing a flexible printed circuit board, the flexible printed circuit board having a fastening section for a chip structure, the positioning of a chip structure on the fastening section of the flexible printed circuit board, and the development of a damper element in such a way that the fastening section of the flexible printed circuit board, the chip structure and the damper element are situated one on top of the other.

In corresponding fashion, the method offers the possibility of producing a damped sensor device, having a small lateral space requirement and a great insensitivity to jolts. Mounting the chip structure may also be decoupled, or rather, separated from the application of the damper element, whereby one may achieve great flexibility in further processing.

In the following text, the present invention will be explained in greater detail with reference to the figures.

BRIEF DESCRIPTION OF THE DRAWINGS

FIGS. 3 to 12 show additional sensor devices, each in a schematic lateral representation.

DETAILED DESCRIPTION OF EXAMPLE EMBODIMENTS

The following figures show possible specific embodiments of sensor devices, which are also designated as "sensor module" or "sensor package". The sensor devices make possible the effective damping of a vibration-sensitive chip structure, and are distinguished by have a low space requirement. Safety systems of motor vehicles such as ESP (electronic stability program) come into consideration, for example, as fields of application of the sensor devices shown. In this instance, this may also involve those ESP systems in which the sensor devices are integrated in control units (or their housings) of ABS systems (anti-lock systems). The design of the sensor devices makes it possible reliably to damp vibrations and other mechanical interferences occurring in the operation of the ABS control units.

Figure 1:
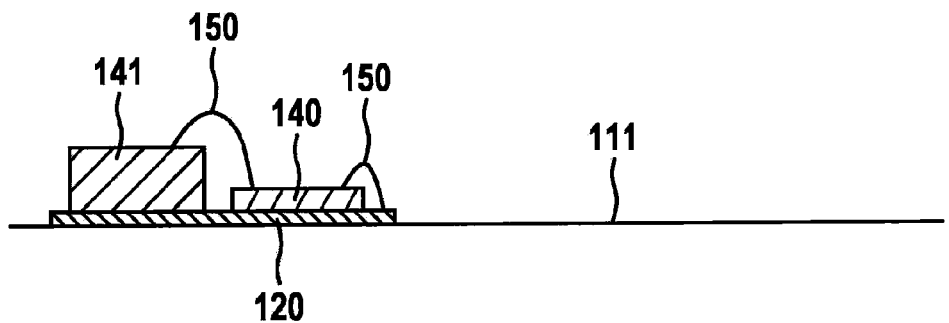
FIGS. 1 and 2 show the production of a sensor device, in each case in a schematic sectional representation.
Figure 2:
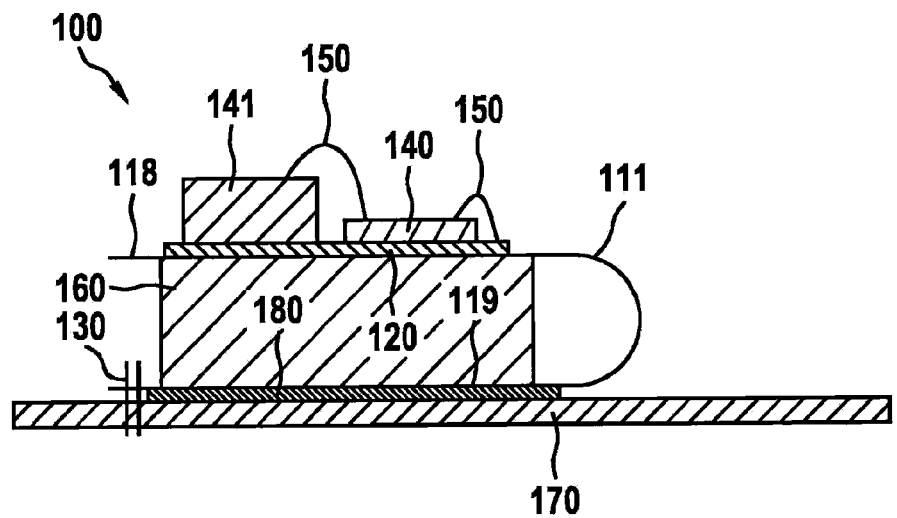

FIGS. 1 to 2 show the production of a sensor device 100, in each case in a lateral sectional representation. In the method, a flexible printed circuit board 111 is provided, on which a chip structure will be situated, as shown in FIG. 1. Flexible printed-circuit board 111 includes, for instance a strip or a foil made of a flexible plastic material, such as a polyimide and, situated on it, printed circuit traces made of an electrically conductive material or a metallic one (not shown). It is also possible to use two polyimide foils and a printed circuit trace structure situated between the foils, or a multi-layer printed-circuit board having a plurality of printed circuit trace planes separated by polyimide foils, which may be electrically connected by an appropriate wiring structure. Instead of the polyimide, one may alternatively also use another flexible and formable plastic material.

Besides the elastic areas, flexible printed circuit board 111 also has a rigid area 120 for carrying the chip structure. Area 120, which will be designated in the following text as fastening section 120, may be developed, as indicated in FIG. 1, for instance, in the form of a rigid plate situated on the foil(s) of printed circuit board 111. In this case, the rigid plate may have a ceramic material.

Alternatively, flexible printed circuit board 111 having rigid fastening section 120 may be provided in a different manner. One possibility, for instance, within the scope of producing the printed circuit board 111, is to laminate a foil of a flexible material (such as polyimide) together with a layer of a curable material (for instance, a resin-fiberglass web). Another possible embodiment is to use a rigid plate (made, for instance, of a metallic material such as steel), and to provide it on that side, of the flexible printed circuit board 111, which is opposite to the side of printed circuit board 111 on which the chip structure is situated (cf. the specific embodiment of FIG. 4).

In order to contact flexible printed circuit board 111 and its printed circuit traces electrically, fastening section 120 is provided with corresponding contact locations (not shown) on the side at which the chip structure is situated. The contact points may particularly be developed in the form of contact surfaces or so-called "bond pads".

An evaluation chip 140 and a micromechanical sensor chip 141 are provided as the chip structure for sensor device 100. The two chips 140, 141, which may be unhoused chips (so-called "bare dies"), are fixed, for example, using an adhesive (not shown) on fastening section 120. After the mounting of chips 140, 141, evaluation chip 140 is electrically connected to sensor chip 141, and to printed circuit board 111 and its printed circuit traces. For this purpose, a wire bonding method is carried out, during the course of which bonding wires 150 are connected to associated contact surfaces or bonding pads (not shown) of chips 140, 141 and of fastening section 120. Based on rigid fastening section 120, in particular, a stabilization is achieved in the bonding wire connections between evaluation chip 140 and sensor chip 141.

To prevent corrosion of the contact surfaces, the contact surfaces or the areas of chips 140, 141 having contact surfaces and fastening section 120 may be further passified and covered (not shown) after the formation of the bonding wire connections with the aid of sealing means. As sealing means, one may use, for example, a sealing gel, such as particularly silicone gel.

Micromechanical sensor chip 141 is developed, for instance, for detecting an acceleration or a rotational rate. For this purpose, sensor chip 141 has one or more movably supported functional elements, such as vibrational structures (not shown) whose deflection is detected in a capacitive manner, for example. Evaluation chip 140, which is used to control sensor chip 141 and to evaluate or further to process measuring signals of sensor chip 141 may be developed particularly as an application-specific integrated circuit (ASIC, application-specific integrated circuit).

After the mounting of the chips 140, 141 onto flexible printed circuit board 111, the developing of the bonding wires connections and perhaps the passivating of the contact points, additional method steps are performed, in order to complete sensor device 100 shown in FIG. 2. In particular, flexible printed circuit board 111 is made into a U-shaped form having two opposite and generally parallel legs 118, 119, which enclose an intermediate area. Fastening section 120, in this instance, is located in the area of the "upper" leg 118 shown in FIG. 2. In the intermediate area, an elastic damper element 160 is situated, which is fixed on the inside to each of the two legs 118, 119, for instance, with the aid of an adhesive (not shown). Damper element 160, by which damping of the chip structure is made possible, has the shape of a parallelepiped, for example.

Different methods may be carried out to produce such a structure. Starting from the arrangement shown in FIG. 1, damper element 160 may first be fastened to one side on flexible printed-circuit board 111 (for instance, on later leg 118, below chips 140, 141). Flexible printed-circuit board 111 may subsequently be transposed into the U-shape, damping element 160 being fixed on the side opposite the side that is fixed first on printed circuit board 111 (or rather on leg 119). One alternative procedure is, for example, to bend printed-circuit board 111 into the U-shape, legs 118, 119 that are formed thereby being generally made to approach simultaneously damper element 160 and being connected to it on the inside.

Damped sensor device 100 produced in this or another way is able to be fastened on additional carrier devices and electrically connected to them. For an exemplary illustration, FIG. 2 shows a rigid board or printed circuit board 170, on which flexible printed circuit board 111, or rather, its "lower leg" 119 is situated. In order to fix flexible printed circuit board 111 reliably on printed-circuit board 170, an adhesive layer 180 may be used, as shown in FIG. 2. An electrical connection between the two printed circuit boards 111, 170 is indicated in the form of a plug connection 130, which is able to be produced using contact elements (e.g. plug strips) that correspond to one another and are provided at printed circuit board 170 and at the end of leg 119 of printed circuit board 111.

Because of damper element 160, upper leg 118 is elastically deflectable with respect to lower leg 119 that is fastened on printed-circuit board 170, and, with that, on fastening section 120. In this way, damping or decoupling is achieved of the chip structure and particularly of micromechanical sensor chip 141 with regard to outer mechanical influences, such as jolts or vibrations, whereby malfunctions or damage connected to these are able to be avoided.

One advantage over usual sensor devices is that, for damper element 160 a large number of different materials is available. The reason for this is that damper element 160 is fastened only to flexible printed circuit board 111 and its legs 118, 119. Also, damper element 160 is able to be produced separately from the other components of sensor device 100, so that in the material selection, restricting conditions, such as particularly sprayability, may be omitted. Possible damper materials for damper element 160 include, for example, silicone materials such as liquid silicone rubber (LSR) and other elastic or formable materials, such as, particularly, rubber materials.

By the selection of the damping material and the geometric dimensions of damper element 160 the damping properties of sensor device 100 is able to be adjusted specifically to desired requirements (interference frequencies of a vibration that is to be damped). One application coming into consideration is the positioning of sensor device 100, that is fastened on printed circuit board 170, in the housing of an ABS control unit, vibrations or interfering accelerations occurring during the operation of the ABS control unit being able to be reliably damped with the aid of damper element 160.

Furthermore, based on the "vertical" arrangement, one on top of the other, of chip structures 140, 141, fastening section 120 and damper element 160, sensor device 100, situated on printed circuit board 170, takes up a smaller lateral space compared to usual sensor devices. The use of flexible printed circuit board 111, via which an electrical connection is able to be produced between the chip structure and evaluation chip 140 and other components, such as printed-circuit board 170 shown in FIG. 2, in addition enables great resistance to falling and insensitivity to jolts. For this purpose, flexible printed circuit board 111 has a "freestanding" region, at the base of the U-shape, which is not connected to damper element 160. In this way, changes in distance between fastening section 120 and printed circuit board 170 and between legs 118, 119, which may occur during damped deflections because of jolts or vibrations, for example, are able to be compensated for, without the electrical connection being interrupted or impaired.

Additional specific embodiments of sensor devices will be explained, with reference to the following figures, which have a comparable or similar design to sensor device 100 shown in FIG. 2. Therefore, with regard to details which refer to substantially identical or identical components, method steps for production as well as possible advantages, we refer to the above statements.

FIG. 3 shows an additional sensor device 101, situated on a rigid printed circuit board 170, in which, as the chip structure, instead of individual unhoused chips, one chip module 145 is situated directly on flexible printed circuit board 111 or rather a fastening section 121 provided with contact points (not shown). Chip module 145 includes a housing (such as a standard premold housing), in which an evaluation chip 140 and a sensor chip 141 are situated. Within the housing, evaluation chip 140 is connected electrically to sensor chip 141 and to contact elements of chip module 145, such as via bonding wires (not shown). The contact elements of chip module 145 are further connected to associated contact points of flexible printed circuit board 111 in fastening section 121 (not shown), which will be discussed in greater detail below. Because of the situation of chips 140, 141 within the housing, a "stiffening" is achieved, so that fastening section 121 of flexible printed circuit board 111, in which, or rather, on which chip module 145 becomes positioned, in contrast to sensor device 100 of FIG. 2, is not developed in the form of a rigid area or provided with an (additional) rigid plate.

To mount chip module 145 on flexible printed circuit board 111, which may take place before transposing of printed circuit board 111 into the U-shape shown in FIG. 3 having legs 118, 119 and before applying damper element 160 on printed circuit board 111, a so-called SMD mounting technique (surface-mounted device) may be used. In this way, one is able to carry out, relatively simply and rapidly, the fastening of chip module 145 on flexible printed circuit board 111, including the producing of contacting between chip modules 145 and printed circuit board 111.

One embodiment is, for example, to develop on the underside of chip module 145, or its housing, and on fastening section 121 of printed circuit board 111, matched arrangements of terminal pads (land grid array, LGA), and to connect these electrically by soldering, which only requires a simple soldering process. Instead of soldering, a conductive adhesive may also be used. It is also possible to provide chip module 145 on its lower side with an arrangement of soldering balls, for instance, in the form of a "ball grid array" (BGA), in order to connect chip module 145 to contact surfaces of printed circuit board 111 by soldering. Alternatively, it is possible to develop chip module 145 so that it has lateral connecting pins, which are able to contact associated contact points of printed circuit board 111 via soldering means or a conductive adhesive.

The design of sensor device 101 of FIG. 3 offers the possibility of realizing the damping of chip module 145 retroactively or additionally, whereby great flexibility is made available. Especially with regard to other parameters and damping requirements, chip module 145 may be developed and optimized. Chip module 145 particularly must not include its own damping elements. To the extent that a damping function is desired, because chip module 145 is developed, for instance, for ESP applications and is to be integrated into an ABS control unit, whereby chip module 145 may be exposed to interfering vibrations, damped device 101, shown in FIG. 3, is able to be produced with chip module 145 and situated on printed circuit board 170.

SMD mounting techniques may also be used in mounting individual chips. For exemplary illustration, FIG. 4 shows an additional sensor device 102 situated on a printed circuit board 170, in which unhoused chips, i.e., an evaluation chip 140 and a sensor chip 141 are situated on flexible printed circuit board 111. Chips 140, 141 are connected via solder balls 151 to corresponding contact surfaces (not shown) of flexible printed circuit board 111, and thereby fastened on printed circuit board 111. In this embodiment, evaluation chip 140 is electrically connected to sensor chip 141 via flexible printed circuit board 111.

For the mounting of chips 140, 141, which again is able to take place before transposing printed circuit board 111 into the U-shape having legs 118, 119, a so-called "flip-chip" method may be carried out, for example. In this instance, chips 140, 141 are situated on flexible printed circuit board 111 using a contacting side on which soldering balls 151 are developed, and a temperature step is carried out whereby solder balls 151 melt, and an electrical connection is produced between chips 140, 141 and contact points of flexible printed circuit board 111. By contrast to a bonding wire method, in this way, a plurality of contacts are simultaneously able to be connected.

In sensor device 102, fastening section 120 of printed circuit board 111, on which chips 140, 141 are situated, is again developed to be rigid. For this purpose, printed circuit board 111 may have a rigid plate, for example, which is situated on a foil (that is flexible and includes printed circuit traces). The rigid plate may have a metallic material, for example, like steel, and, as indicated in FIG. 4, is able to be provided on that side of printed circuit board 111 which is opposite to the side of printed-circuit board on which chips 140, 141 are situated. In this case, as shown in FIG. 4, a part of damper element 160 is able to project beyond the rigid plate laterally at the edge and laterally enclose the plate.

Alternatively, rigid fastening section 120 may be developed in a different manner, the embodiments described above being able to come into consideration. Since an electrical connection between chips 140, 141 is produced without bonding wires, instead of a rigid fastening section 120, a flexible section may also be considered on which chips 140, 141 are situated.

FIG. 5 shows a further possible embodiment of a sensor device 103. Sensor device 103 has a flexible printed circuit board 111 having a rigid fastening section 120, on which an (unhoused) chip structure is situated having an evaluation chip 140 and a sensor chip 141. Chips 140, 141 may, for instance, be adhered to fastening section 120, corresponding to sensor device 100 of FIG. 2, and be electrically connected among one another and to flexible printed circuit board 111. Alternatively, corresponding to sensor device 102 of FIG. 4, chips 140, 141 may be fastened via solder bumps (not shown) on to fastening section 120, the mounting taking place within the scope of an SMD method or a flip-chip method. In this embodiment, flexible printed circuit board 111 may also be developed without a rigid fastening section 120.

By contrast to sensor devices 100, 101, 102, flexible printed circuit board 111 in sensor device 103 of FIG. 5 is not transposed into a U-shape. A damper element 160 used for damping the chip structure is therefore fastened only at one location on flexible printed circuit board 111 and at fastening section 120 in an area below chips 140, 141. In this context, chips 140, 141 and damper element 160 are located on different sides of flexible printed circuit board 111 and of section 120. In this case, damper element 160 may again be fixed via an adhesive (not shown) to printed circuit board 111. The production of sensor device 103 may take place, for example, in that first, chips 140, 141 are mounted on flexible printed circuit board 111, whereby a structure corresponding to FIG. 1 may be present, and subsequently, damper element 160 is fastened to printed circuit board 111.

As shown in FIG. 5, sensor device 103 may further be situated with damper element 160 on a carrier device 171, and be fixed on it, for instance, with the aid of an adhesive (not shown). Carrier device 171 is a housing, for example, or a housing section of a control unit, such as of an ABS system. As an alternative, carrier device 171 may also be a separate printed circuit board. Furthermore, flexible printed circuit board 111 may be electrically connected to an additional rigid printed circuit board 170, again a plug connection 130 being able to be provided, as was indicated in FIG. 5. Rigid printed circuit board 170 may, for instance, also be situated in the aforementioned housing of a control unit.

Sensor device 103 of FIG. 5 offers the possibility of a "separation" of damped fastening (on carrier device 171) and electrical contacting (with printed circuit board 170). In this way it may be utilized, for example, that carrier device 171, in contrast to printed circuit board 170, proves more favorable for fastening sensor device 103, because, for instance, fewer mechanical interferences are "produced", there is more space available and/or better adhesion is possible. The advantages named in connection with sensor devices 100, 101, 102 described above, also come about in the case of sensor device 103 of FIG. 5. In particular, sensor device 103, based on the "vertical" arrangement of one over another of chip structure 140, 141, fastening section 120 and damper element 160, requires only a small lateral base area on carrier device 171. Also, because of flexible printed circuit board 111, great resistance to falls and insensitivity to jolts is achieved.

FIG. 6 shows an additional sensor device 104, which has generally the same design as sensor device 103 of FIG. 5. Instead of an unhoused chip structure, however, sensor device 104 has a housed chip module 145, having an evaluation chip 140 and a sensor chip 141. There is also no rigid fastening section provided, so that chip module 145 is situated on a flexible section or fastening section 121 of printed circuit board 111. In this instance, chip module 145 and damper element 160 used for damping are again situated on different sides of flexible printed circuit board 111, damper element 160 being provided underneath chip module 145.

To produce sensor device 104, the abovementioned process steps may be carried out in a corresponding manner. In particular, chip module 145 may be positioned on printed circuit board 111 with the aid of an SMD mounting technique, which may take place before or after the fastening of damper element 160. As is also shown in FIG. 6, sensor device 104 may furthermore be fastened with damper element 160 on a carrier device 171, and flexible printed circuit board 111 may be electrically connected to a (separate) printed circuit board 170, for instance, via a plug connection 130.

Instead of positioning a chip structure and a damper element as in the previously described sensor devices 100, 101, 102, 103, 104 on different sides of a flexible printed circuit board 111, these components may also be provided on the same side of a flexible printed circuit board 111 and bordering on one another. On this point, the following figures show additional specific embodiments of sensor devices. With regard to details which refer to substantially identical or identical components, method steps for production as well as possible advantages, we refer to the above statements.

FIG. 7 shows a sensor device 105 having such a design. Sensor device 105 has a U-shaped flexible printed circuit board 111, having two legs 118, 119, which enclose an intermediate area. In the intermediate area, on or at upper leg 118, shown in FIG. 7, an (unhoused) chip structure is situated, having an evaluation chip 149 and a sensor chip 141. Leg 118 has a rigid fastening area 120, in this case.

In the intermediate area and bordering on chips 140, 141, a damper element 160 is also provided, which additionally encloses chips 140, 141, and is therefore also connected partially to fastening section 120 and upper leg 118 shown in FIG. 7. Besides to upper leg 118, damper element 160 is further connected to lower leg 119. Because of the enclosing, or rather encapsulating of chips 140, 141, damper element 160, in addition to performing a damping function, is able to effect a protection and passivation of chips 140, 141.

Sensor device 105 may be produced, for example, by first situating chips 140, 141, according to the abovementioned methods (adhering and wire bonding or SMD mounting or flip-chip mounting) on flexible printed circuit board 111, whereby a structure corresponding to FIG. 1 may be present, for example, and by subsequently developing damper element 160 enclosing chips 140, 141 on printed circuit board 111. For this purpose, for example, a suitable damping material, in liquid or viscous form may be applied or sprayed onto printed circuit board 111, in the area of chips 140, 141. After the hardening of the damping material, printed circuit board 111 may be transposed into the U-shape, and hardened damping material 160 may be connected, for example, by adhesion, to leg 119 that lies opposite leg 118. Because of the one over another positioning of fastening section 120, chips 140, 141 and damping element 160 (that partially encloses chips 140, 141), sensor device 105 also has a small lateral base area.

Damped sensor device 105 is able to be fastened on additional carrier devices and to be electrically connected to them. For this, FIG. 7 shows a rigid printed circuit board 170, on which flexible printed circuit board 111, or rather its leg 119, is fixed with the aid of adhesive layer 180, an electrical connection between the two printed circuit boards 111, 170 being produced by a plug connection 130.

FIG. 8 shows a further sensor device 106. Sensor device 106 again has a U-shaped flexible printed circuit board 111, having two legs 118, 119, which enclose an intermediate area. In the intermediate area, on or at upper leg 118, shown in FIG. 8, a housed chip module 145 is situated, having an evaluation chip 140 and a sensor chip 141. In the intermediate area, bordering on chip module 145, a damper element 160 is provided, which is additionally connected to lower leg 119.

Sensor device 106 may be produced, for example, by first positioning chip module 145 on flexible printed circuit board 111 (by performing SMD mounting), and subsequently damper element 160 is applied onto, or adhered onto chip module 145. Flexible printed circuit board 111, in this case, has no rigid but a flexible fastening section 121, since an appropriate stiffening is achieved by the housing of chip module 145. After that, printed circuit board 111 may be transposed into the U-shape, and damper element 160 may be connected, (for example, by adhesion), to leg 119 that lies opposite leg 118. Damped sensor device 106 produced in this way may be fastened to additional carrier devices and electrically connected to them, as illustrated anew in FIG. 8, with the aid of printed circuit board 170.

FIG. 9 shows an additional sensor device 107, in which, corresponding to sensor device 105 of FIG. 7, on a fastening section 120 of a flexible printed circuit board 111, unhoused chips 140, 141, and additionally a damper element 160 enclosing chips 140, 141, are provided. For the development of damper element 160, the method steps given in connection with sensor device 105 may be carried out.

In sensor device 107 of FIG. 9, however, flexible printed circuit board 111 is not transposed into a U-shape, in contrast to sensor device 105. Therefore, sensor device 107 may be positioned or fastened with damper element 160 on a carrier device 171, corresponding to sensor device 103 of FIG. 5. Also, an electrical connection between flexible printed circuit board 111 and a printed circuit board 170, that is separate from carrier device 171, may be produced via a plug connection 130.

FIG. 10 shows an additional sensor device 108, in which, corresponding to sensor device 106 of FIG. 8, on a flexible printed circuit board 111 a chip module 145, and bordering on chip module 145, a damper element 160 is provided. However, in deviation from sensor device 106, flexible printed circuit board 111 is not transposed into a U-shape, so that sensor device 108, corresponding to sensor device 104 of FIG. 6, is able to be situated with damper element 160 on a carrier device 171. Also, an electrical connection between flexible printed circuit board 111 and a printed circuit board 170, that is separate from carrier device 171, may be produced, for instance, via a plug connection 130.

Figure 11:
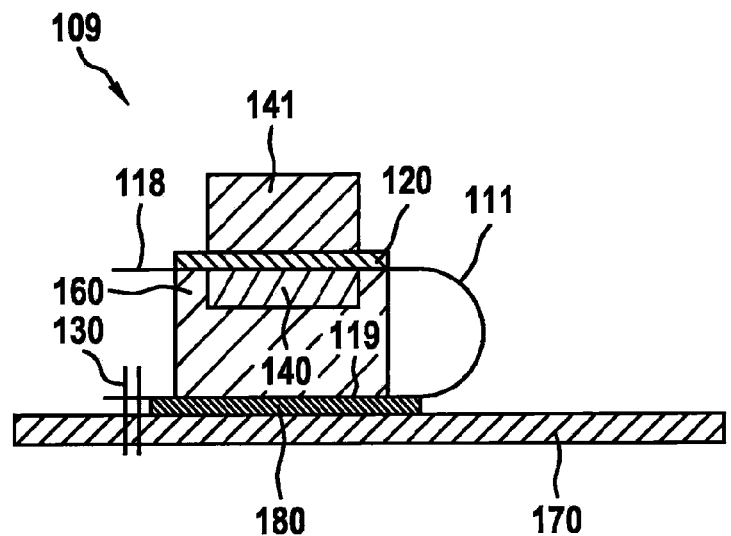

Instead of providing chips on the same side of a flexible printed circuit board 111, there is alternatively the possibility of situating them on different sides. In this regard, FIG. 11 shows an additional sensor device 109, having an evaluation chip 140 and a sensor chip 141. The two chips 140, 141 are situated on different sides on a rigid fastening section 120 of flexible printed circuit board 111.

Chips 140, 141 may, for instance, be adhered to fastening section 120 and be electrically connected via bonding wires (not shown) to contact points of flexible printed circuit board 111. Alternatively, chips 140, 141 may also be situated on fastening section 120 via an SMD method or a flip-chip method, solder bumps (not shown) being able to be used. The two chips 140, 141 are electrically connected to each other via fastening section 120, or rather, a contact structure or a rewiring structure provided in fastening section 120.

Flexible printed circuit board 111 once again has a U-shaped form having two legs 118, 119, which enclose an intermediate area, in which evaluation chip 140 is also situated. In the intermediate area and bordering on evaluation chip 140, a damper element 160 is provided, which additionally encloses evaluation chip 140, and is therefore also connected partially to fastening section 120 and upper leg 118 shown in FIG. 11. Besides to upper leg 118, damper element 160 is further connected to lower leg 119. Because of this one over the other situation of sensor chip 141, fastening section 120, evaluation chip 140 and of damper element 160 (that partially encloses chip 140), a (laterally) space-saving design is even more favored.

Sensor device 109 may be produced, for example, by first positioning chips 140, 141 on different sides of flexible printed circuit board 111, subsequently developing damper element 160, that encloses evaluation chip 140, on printed circuit board 111 (for instance, by applying a damper material in liquid or viscous form, and hardening it), and subsequently transposing printed circuit board 111 into the U-shape, damper element 160 being connected to leg 119, that lies opposite to leg 118, by adhesion, for example. Sensor device 109 produced in this way may be fastened to an additional carrier device and electrically connected to it, as shown in FIG. 11, with the aid of rigid printed circuit board 170.

Figure 12:
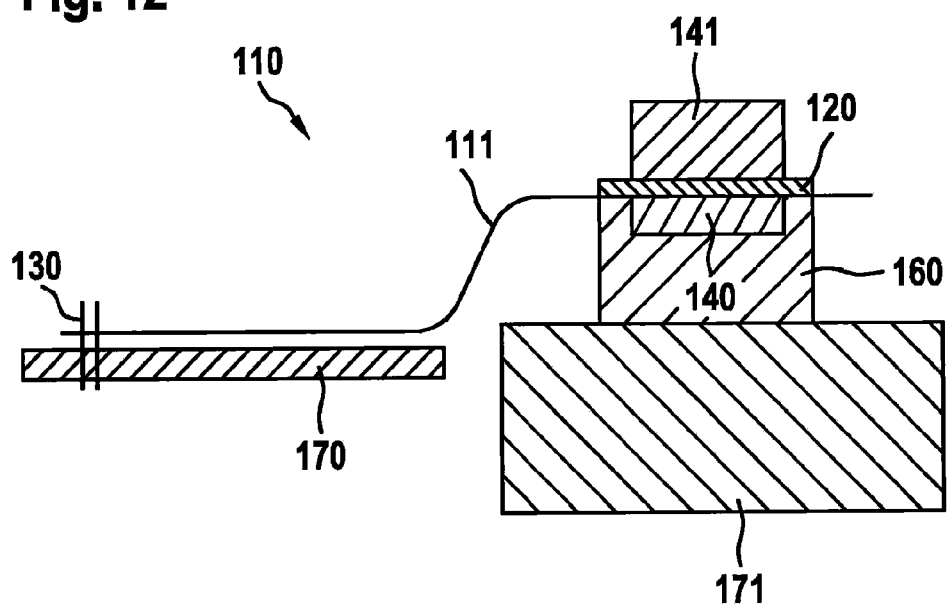

FIG. 12 shows an additional sensor device 110, in which, corresponding to sensor device 109 of FIG. 11, on different sides of a fastening section 120 of a flexible printed circuit board 111, an evaluation chip 140 and a sensor chip 141 are situated, and additionally a damper element 160, enclosing evaluation chip 140, is provided. However, flexible printed circuit board 111 is not transposed into a U-shape. As a result, sensor device 111 having damper element 160 is able to be positioned on a carrier device 171. An electrical connection between flexible printed circuit board 111 and a printed circuit board 170, that is separate from carrier device 171, may be produced via a plug connection 130, for example.

The specific embodiments of sensor devices, explained with the aid of the figures, as well as the methods for producing them represent preferred or exemplary specific embodiments of the present invention. Besides the specific embodiments described and illustrated, additional specific embodiments are possible, which may include further modifications as well as combinations of features. For instance, sensor devices 109, 110, shown in FIGS. 11 and 12, may be modified in such a way that the respective damper element 160 is situated on sensor chip 141 instead of evaluation chip 140, and encloses it. With reference to sensor devices 103, 104, 107, 108, 110, shown in FIGS. 5, 6, 9, 10, 12, in which flexible printed circuit board 111 is not present in a U-shape, there is the possibility of using a common carrier device, on which both damper element 160 is situated and to which flexible printed circuit board 111 is electrically connected.

A further variant is, even when a chip module 145 is used, to use a flexible printed circuit board 111 having a rigid fastening section 120, on which the chip module will be situated. With regard to plug connections 130 shown in the figures, other connections and standard connections may be provided for producing electrical contacting.

In addition, sensor devices are possible which have a different number of chips. One example is a sensor device having an evaluation chip and three sensor chips, in order to record accelerations in three spatial directions that are at right angles to one another. In this case, too, different embodiments come into consideration, that is, for instance, that the chips are able to be provided as unhoused chips or may be provided in one chip module, that all the chips are able to be situated on one side of a flexible printed circuit board or on different sides, that a damper element is able to be situated on the same side of the printed circuit board as the chips (or a part of the chips) or on an opposite side, etc.

Instead of producing a damper element separately and adhering the damper element onto a flexible printed circuit board or a chip module, a damper element may also be provided (corresponding to sensor devices 105, 107, 109, 110), for instance, by applying it in liquid or viscous form and hardening it. Furthermore, the materials named for components of the sensor devices should be regarded as being only examples, which could be replaced by other materials, if desired.

What is claimed is:

1. A sensor device, comprising:
a flexible printed circuit board having a fastening section for a chip structure;
the chip structure situated on the fastening section of the flexible printed circuit board;
a carrier device; and
a damper element provided on at least the fastening section of the flexible printed circuit board for damping the chip structure from mechanical influences,
wherein
the flexible printed circuit board is electrically connected to the carrier device,
the flexible printed circuit board has a first side and a second side that is opposite to the first side,
the chip structure is situated on the first side of the flexible printed circuit board,
the damper element is provided on the second side of the flexible printed circuit board and not on provided on the chip structure, and
the fastening section of the flexible printed circuit board, the chip structure, and the damper element are situated one over the other.

2. The sensor device as recited in claim 1, wherein the flexible printed circuit board has a U-shaped form having a first leg and a second leg, which enclose an intermediate area.

3. The sensor device as recited in claim 2, wherein the damper element is situated in the intermediate area.

4. The sensor device as recited in claim 1, wherein the fastening section is a rigid section of the flexible printed circuit board.

5. The sensor device as recited in claim 1, wherein the chip structure includes one of the following components: i) sensor chip, ii) an evaluation chip, or iii) a chip module.

6. A method for producing a sensor device, comprising:
providing a flexible printed circuit board, the flexible printed circuit board having a fastening section for a chip structure;
positioning the chip structure on the fastening section of the flexible printed circuit board on a first side of the flexible printed circuit board; and
bending the flexible printed circuit board into a U-shaped form having a first leg and a second leg in such a way that a second side of the flexible printed circuit board opposite of the first side is in between the first leg and second leg,
developing a damper element on at least the fastening section of the flexible printed circuit board on the second side in such a way that the fastening section of the flexible printed circuit board, the chip structure and the damper element are situated one over the other,
wherein the damper element is configured to provide the chip structure damping from mechanical influences and is not provided on the chip structure.

7. A sensor device, comprising:
a flexible printed circuit board having a fastening section for a chip structure at a first end of the flexible printed circuit board and having a first side and a second side that is opposite to the first side;
the chip structure situated on the fastening section of the flexible printed circuit board;
a first carrier device;
a second carrier device; and
a damper element provided on at least the second carrier device and the second side of the flexible printed circuit board for damping the chip structure from mechanical influences;
wherein the flexible printed circuit board electrically connected to the first carrier device at a second end of the flexible printed circuit board, and
the fastening section of the flexible printed circuit board, the chip structure, the second carrier device, and the damper element are situated one over the other.

8. The sensor device as recited in claim 7, wherein the second carrier device is a housing.

9. A method for producing a sensor device, comprising:
providing a flexible printed circuit board, the flexible printed circuit board having a fastening section for a chip structure;
positioning the chip structure on the fastening section of the flexible printed circuit board;
providing a first carrier device;
providing a second carrier device;
electrically connecting the flexible printed circuit board to the first carrier device; and
developing a damper element on at least a surface of the second carrier device in such a way that the fastening section of the flexible printed circuit board, the chip structure, the second carrier device, and the damper element are situated one over the other,
wherein the damper element is provided between the second carrier device and the flexible printed circuit board and is configured to provide the chip structure damping from mechanical influences.

10. The sensor device as recited in claim 7, wherein the chip structure is provided on the first sides of the flexible printed circuit board and the damper is not provided on the chip structure.

11. The sensor device as recited in claim 7, wherein the chip structure is provided on the second side of the flexible printed circuit board and the damper additionally encloses the chip structure.

12. A sensor device, comprising:
a flexible printed circuit board having a fastening section for at least one chip structure;
a first chip structure situated on the fastening section of the flexible printed circuit board;
a second chip structure situated on the fastening section of the flexible printed circuit board;
a damper element provided on at least the fastening section of the flexible printed circuit board for damping the second chip structure from mechanical influences, and
a first carrier device,
wherein
the flexible printed circuit board is electrically connected to the first carrier device,
the flexible printed circuit board has a first side and a second side that is opposite to the first side,
the first chip structure is situated on the first side of the flexible printed circuit board,
the second chip structure is situated on second side of the flexible printed circuit board,
the damper element is provided on the second side of the flexible printed circuit board to enclose the second chip structure,
the damper element is not provided on the first side of the flexible printed circuit board, and
the fastening section of the flexible printed circuit board, the first chip structure, and the damper element are situated one over the other.

13. The sensor device of claim 12, wherein the flexible printed circuit board has a U-shaped form having a first leg and a second leg, which enclose an intermediate area, the damper element is situated in the intermediate area, the first chip structure is situated on the first leg, and the second leg is fastened to the first carrier device.

14. The sensor device of claim 12, further comprising a second carrier device, wherein the flexible printed circuit board is electrically connected to the first carrier device at a first end of the flexible printed circuit board, the damper element is provided on second carrier device such that the damper element is between the flexible printed circuit board and the second carrier device.

15. The method of claim 6, further comprising providing a second chip structure such that the damper encloses the second chip structure.

* * * * *